(12) United States Patent
Tůma et al.

(10) Patent No.: US 11,598,733 B2
(45) Date of Patent: Mar. 7, 2023

(54) METHOD OF EXAMINING A SAMPLE USING A CHARGED PARTICLE MICROSCOPE

(71) Applicant: FEI Company, Hillsboro, OR (US)

(72) Inventors: Tomas Tůma, Brno (CZ); Jan Klusáček, Brno (CZ); Jiri Petrek, Brno (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/941,253

(22) Filed: Jul. 28, 2020

(65) Prior Publication Data

US 2021/0033548 A1  Feb. 4, 2021

(51) Int. Cl.
*G01N 23/22* (2018.01)
*G01N 23/2206* (2018.01)
*G01N 23/203* (2006.01)
*G01N 23/2252* (2018.01)

(52) U.S. Cl.
CPC ....... *G01N 23/2206* (2013.01); *G01N 23/203* (2013.01); *G01N 23/2252* (2013.01); *G01N 2223/401* (2013.01); *H01J 2237/225* (2013.01)

(58) Field of Classification Search
CPC ........ H01J 2237/225; G01N 2223/401; G01N 23/203; G01N 23/2206; G01N 23/2252
See application file for complete search history.

(56) References Cited

U.S. PATENT DOCUMENTS

| | | | |
|---|---|---|---|
| 5,357,110 A | 10/1994 | Statham et al. | |
| 11,002,692 B2* | 5/2021 | Tuma | H01J 37/261 |
| 11,017,292 B2* | 5/2021 | Eleftheriou | G06N 3/0635 |
| 11,337,671 B2* | 5/2022 | Fan | A61B 6/482 |
| 2012/0292503 A1* | 11/2012 | Phifer, Jr. | H01J 37/222 250/307 |
| 2013/0015351 A1* | 1/2013 | Kooijman | H01J 37/28 250/307 |
| 2014/0035943 A1* | 2/2014 | Statham | G06T 11/001 345/593 |
| 2015/0122992 A1 | 5/2015 | Owen | |
| 2015/0338358 A1* | 11/2015 | Owen | G01N 23/2252 250/305 |
| 2016/0086762 A1* | 3/2016 | de Jong | H01J 37/21 250/307 |

(Continued)

FOREIGN PATENT DOCUMENTS

| | | |
|---|---|---|
| WO | 2015138619 | 9/2015 |
| WO | 2019016559 | 1/2019 |

*Primary Examiner* — Wyatt A Stoffa

(57) ABSTRACT

The invention relates to a method of examining a sample using a charged particle microscope, comprising the steps of providing a charged particle beam, as well as a sample; scanning said charged particle beam over said sample; and detecting, using a first detector, emissions of a first type from the sample in response to the beam scanned over the sample. Spectral information of detected emissions of the first type is used for assigning a plurality of mutually different phases to said sample. In a further step, a corresponding plurality of different color hues—with reference to an HSV color space—are associated to said plurality of mutually different phases. Using a second detector, emissions of a second type from the sample in response to the beam scanned over the sample are detected. Finally an image representation of said sample is provided.

14 Claims, 4 Drawing Sheets

(56) References Cited

U.S. PATENT DOCUMENTS

2016/0189922 A1\* 6/2016 Kooijman .......... G01N 23/2257
 250/307
2019/0186910 A1\* 6/2019 Fukuda .............. G01N 23/2251

\* cited by examiner

METHOD OF EXAMINING A SAMPLE USING A CHARGED PARTICLE MICROSCOPE

FIELD OF THE INVENTION

The present description relates generally to methods and systems for examining sample using a charged particle microscope, and more particularly, to detecting emissions of a first type from the sample in response to a charged particle beam scanned over the area of the sample, and using spectral information of detected emissions of the first type for examining said sample.

BACKGROUND OF THE INVENTION

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various subspecies, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. The skilled person will be familiar with the different species of charged particle microscopy.

Irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons). One or more components of this emanating radiation may be detected and used for sample analysis.

Typically, in a SEM, backscattered electrons are detected by a solid state detector in which each backscattered electron is amplified as it creates many electron-hole pairs in a semiconductor detector. The backscattered electron detector signal is used to form an image as the beam is scanned, with the brightness of each image point determined by the number of backscattered electrons detected at the corresponding point on the sample as the primary beam moves across the sample. The image merely provides information on the topology of the sample to be examined.

In a process called "energy dispersive x-ray spectroscopy" or "EDS", the energies of x-rays coming from the sample in response to the electron beam are measured and plotted in a histogram to form a material specific spectrum. The measured spectrum can be compared to known spectra of various elements to determine which elements and minerals are present in said sample.

One of the drawbacks of EDS is that it takes considerable time to accumulate an x-ray spectrum for the sample. Typically, a grid with discrete analysis points is used. The electron beam dwells on each analysis point while the EDS detectors record x-rays. Once sufficient x-ray counts are recorded the beam moves to the next analysis point. The signal from the EDS detectors is fed to a signal processing unit that builds an x-ray spectrum curve for each analysis point, which can be matched to an extensive library of known mineral phases to select the best match for that analysis point.

It is known to use an extensive post-processing analysis for combining both EDS data and SEM data into a single image of the sample being examined. The post-processing analysis takes a lot of resources, and hence a lot of time, to be completed and to be shown to a user.

With this in mind, it is an object of the present invention to provide an improved method of examining a sample using a charged particle microscope, wherein spectral information of detected emissions is used for examining said sample. In particular, it is an object of the present invention to provide a method and apparatus for more rapidly and/or more accurately acquiring information about a sample and providing said information to a user.

SUMMARY OF THE INVENTION

The invention provides a method of examining a sample using a charged particle microscope. The method comprises the steps of providing a charged particle beam, as well as a sample, and scanning said charged particle beam over said sample. The method comprises the step of detecting, using a first detector, emissions of a first type from the sample in response to the beam scanned over the sample. The method further comprises the step of using spectral information of detected emissions of the first type for assigning a plurality of mutually different phases to said sample. Now, as defined herein, the method comprises the step of associating, with reference to an HSV color space, a corresponding plurality of different color hues to said plurality of mutually different phases. This means that different hues (e.g. green, red, orange, blue) are assigned to different phases (e.g. elements, chemical substance, minerals, etc.). The HSV color space is a color space that uses hue (often referred to as "color", e.g. red, green, blue), saturation (often referred to as the intensity or pureness of the color) and value (often referred to as lightness or darkness of the color) to describe attributes of a specific color. The HSV color space can be represented in a cylindrical geometry, with hue, its angular dimension, starting at the red primary at 0°, passing through the green primary at 120° and the blue primary at 240°, and then wrapping back to red at 360°. The central vertical axis comprises the neutral, achromatic, or gray colors, ranging from black at value 0, the bottom, to white at value 1, the top. With increasing radius, the saturation of the color increases.

In principle, any color can be described in the HSV color space regardless of the actual color space being used. Thus, the method as described herein is not limited to the use of a specific color space and can be applied in an RGB color space (since all RGB colors can be described with reference to an HSV color space as well) as well, or any other color space for that matter.

As defined herein, the method further comprises the step of detecting, using a second detector, emissions of a second type from the sample in response to the beam scanned over the sample.

According to the method, a control unit is used to provide an image representation of said sample, wherein use is made of emissions of said second type and said image representation contains said associated different color hues for representing said plurality of different phases as well. Said control unit is arranged for analyzing the emissions of said first type and combining the results of the analysis with the emissions of the second type for providing an image representation of the sample. In particular, the control unit may be arranged for providing an image representation in real-time, e.g. whilst the charged particle beam is being scanned over said sample. By using said control unit it becomes possible to provide a real-time colored image representation of the sample to the user, wherein the colored image contains information of the phases, encoded in said different hues. Said image representation can be a single image, although the use of a plurality of images, or a data table containing image representation or the like, is conceivable as well. Said image representation may also contains different values and/or different saturations.

Said emissions of said second type may, for example, be secondary electrons and/or backscattered electrons. Said emissions of said second type are in an embodiment used to encode different values within said image representation. In other words, SEM is used to obtain a gray-scale image of the sample being examined, and color is used, preferably on top of that image, to encode the spectral data related to emissions of the first type, preferably related to EDS, within said image representation. The emissions of the first type are in an embodiment used to encode different saturations within said image representation. This way, an image representation of the sample that contains meaningful data encoded in an HSV color space may be provided to the user, and substantially in real time as well.

With this, the object as defined herein is achieved. Embodiments of the method will now be explained in more detail.

DETAILED DESCRIPTION OF EMBODIMENTS

Figure 1:
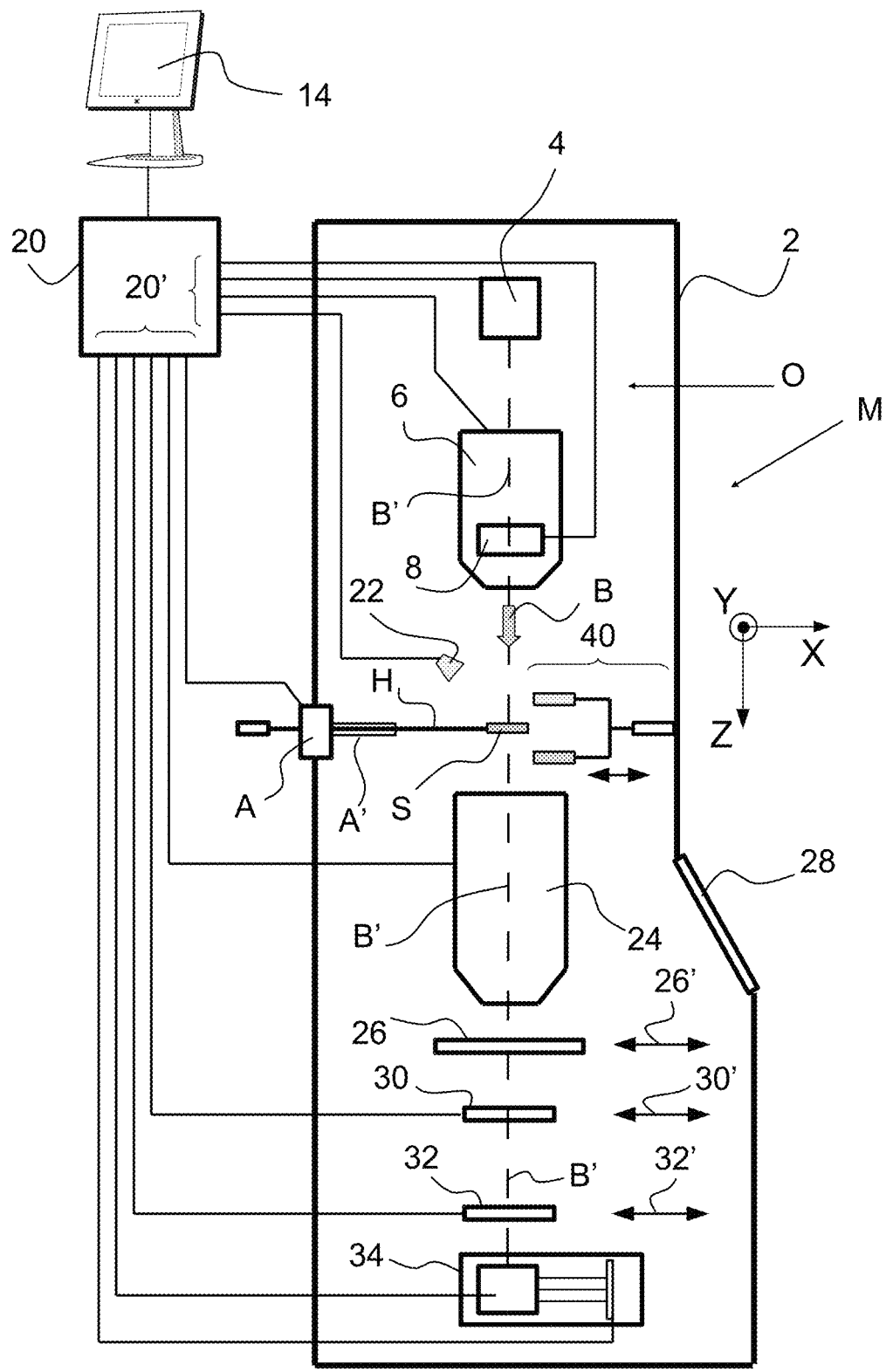
FIG. 1—shows a longitudinal cross-sectional view of a charged particle microscope according to a first embodiment of the invention.

In an embodiment, the method comprises the step of providing a spectral data stack and storing said detected emissions of said first type and/or spectral information of said detected emissions of said first type in said spectral data stack. The spectral data stack is used as a data structure that enables raw input data relating to emissions of the first type to be created, stored, and maintained in an efficient way. The spectral data stack can then be used to assign a plurality of mutually different phases to said sample, using spectral information of detected emissions of the first type. The spectral data stack can be used for hierarchically organizing the raw input data, thereby enabling efficient computational processing of the raw input data by the control unit.

In an embodiment, the method comprises the step of providing a chemical composition data stack and storing said plurality of mutually different phases in said chemical composition data stack. The spectral data stack may contain the raw input data, and the chemical composition data stack may comprise the analyzed data of the spectral data stack, including the associated phases (i.e. chemical composition). Thus, the spectral data stack is processed and analyzed and the results are stored in a new data stack (in this embodiment the chemical composition data stack). This provides for efficient storage and manipulation of data, and keeps the raw input data in an organized structure as well, for example for later use.

In an embodiment, the method comprises the step of providing a color data stack and storing said plurality of different color hues in said color data stack. In this embodiment, an additional data stack may be provided (next to the spectral data stack and/or chemical composition data stack, for example). This provides for efficient storage and manipulation of data, as intermediate results are readily available.

In an embodiment, at least one of said plurality of data stack layers comprises a number of pixels, wherein each pixel is associated with a part of said sample. The pixel may be associated to an analysis point of the grid, as mentioned in the introduction. The pixel may also be associated with the resolution that can be obtained with the charged particle microscope.

In an embodiment, at least one of said data stacks (e.g. spectral data stack, chemical composition data stack, and/or color data stack) comprises a plurality of data stack layers. A first of the data stack layers may comprise data on a per pixel basis (i.e. substantially each pixel contains one associated data entry). For example, each pixel of the first data stack layer corresponds to one analysis point of the grid.

It is conceivable that the number of pixels is substantially different for each data stack layer. A further (e.g. a second) data stack layer may then comprise data on a so-called superpixel basis, wherein each superpixel comprises a plurality of grouped pixels (such as pixels in the first data stack layer). This way, two or more pixels in the first data stack layer are grouped together into one superpixel in the further data stack layer, and substantially each superpixel contains one associated data element for that superpixel. It is conceivable that yet a further (e.g. a third) data stack layer is used, containing larger superpixels (i.e. each superpixel containing more grouped pixels, compared to the superpixels of the previous data stack layer). The number of superpixels in each data stack layer decreases with the increased data stack layers. In effect, this allows for a certain granularity to be increased and/or decreased with increasing/decreasing data stack layers. This allows for rapid and efficient data processing and analysis, as data can be collected and stored on a very large superpixel basis, and with increasing incoming data the granularity can be increased until the actual pixel size is obtained.

In an embodiment, the structure, including the number of layers and pixels, in the spectral data stack, the chemical composition stack and the color data stack is identical. This allows for easy comparison and data analysis of the different data stacks.

In an embodiment, the method comprises the step of providing a blended stack by flattening said color data stack, and using said blended stack in providing said image representation. Flattening may contain manipulation of one or more data stack layers, when present, of said color data stack, for providing a single layer color data stack. The step of flattening may comprises the step of assigning weights to different layers and/or different pixels, such that these layers and/or pixels contribute to the color with inequal strength. Additionally, a layer-dependent blurring may be used to achieve visually pleasing effects.

In an embodiment, the method comprises the step of combining said blended stack with detected emissions of said second type for providing said image representation. Said single layer color data stack can be combined with emissions of the second type (i.e. a black-and-white image), for providing an image representation containing different color hues (within an HSV color space) for representing mutually different phases having an HSV color space.

In an embodiment, said first detector comprises an EDS detector.

In an embodiment, said second detector comprises an electron detector, such as an BSE detector.

According to an aspect, a charged particle microscope for examining a sample using the method as defined herein is provided. Said charged particle microscope comprises:
- an optics column, including a charged particle source, a final probe forming lens and a scanner, for focusing a beam of charged particles emitted from said charged particle source onto a specimen;
- a specimen stage positioned downstream of said final probe forming lens and arranged for holding said specimen;
- a first detector for detecting emissions of a first type originating from said specimen in response to the incidence of charged particles emitted from said charged particle source;
- a second detector for detecting emissions of a second type originating from said specimen in response to the incidence of charged particles emitted from said charged particle source;
- a control unit and a processing device connected to said first detector;

wherein said charged particle microscope is arranged for executing the method as defined herein.

FIG. 1 (not to scale) is a highly schematic depiction of an embodiment of a charged-particle microscope M according to an embodiment of the invention. More specifically, it shows an embodiment of a transmission-type microscope M, which, in this case, is a TEM/STEM (though, in the context of the current invention, it could just as validly be a SEM (see FIG. 2), or an ion-based microscope, for example). In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a specimen S (which may, for example, be (locally) thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction) (and/or allows scanning motion to be performed, as an alternative to beam scanning). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX or EDS (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:
- TEM camera 30. At camera 30, the electron flux can form a static image (or diffractogram) that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.
- STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).
- As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable X-ray Computed Tomography (CT) module, generally indicated by reference 40. In Computed Tomography (also referred to as tomographic imaging) the source and (diametrically opposed) detector are used to look through the specimen along different lines of sight, so as to acquire penetrative observations of the specimen from a variety of perspectives.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

The charged particle microscope M according to the invention, and of which an embodiment is shown in FIG. 1, thus comprises an optics column O, including a charged particle source 4, a final probe forming lens 6 and a scanner 8, for focusing a beam B of charged particles emitted from said charged particle source 4 onto a specimen. The apparatus further comprises a specimen stage A,H positioned downstream of said final probe forming lens 6 and arranged for holding said specimen S. The apparatus furthermore comprises a first detector 22 for detecting emissions of a first type originating from said specimen in response to the incidence of charged particles B emitted from said charged particle source 4. The apparatus furthermore comprises a second detector 24 for detecting emissions of a second type originating from said specimen in response to the incidence of charged particles emitted from said charged particle source. In the embodiment shown, the first detector 22 is the analysis device 22, which—as mentioned before—might be a combined scintillator/photomultiplier or EDS (Energy-Dispersive X-Ray Spectroscopy) module. In a preferred embodiment, said first detector is an EDS. Furthermore, the apparatus according to the invention comprises the control device 20 that is connected (by means of lines 20') to said first detector 22 (schematically shown). According to the invention, said charged particle microscope M is arranged for executing the method according to the invention, which will later be explained by means of FIG. 4.

Figure 2:
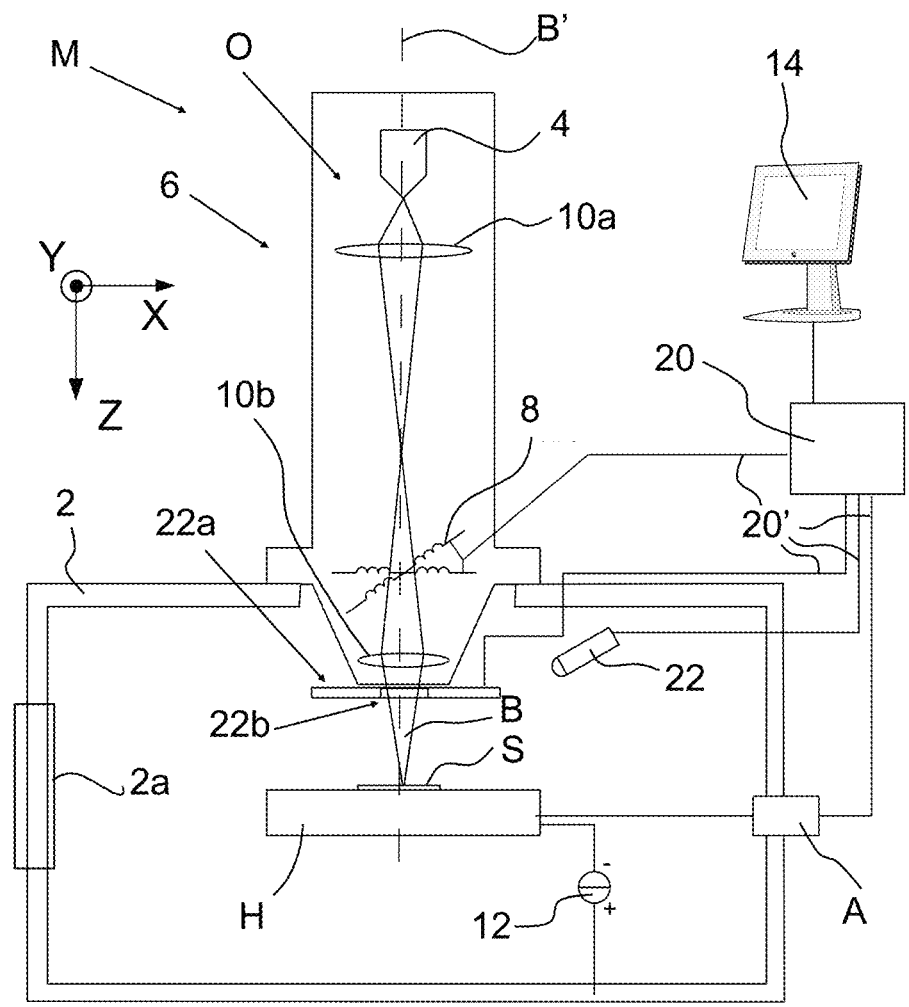
FIG. 2—shows a longitudinal cross-sectional view of a charged particle microscope according to a second embodiment of the invention.

Now first referring to FIG. 2, another embodiment of an apparatus according to the invention is shown. FIG. 2 (not to scale) is a highly schematic depiction of a charged-particle microscope M according to the present invention; more specifically, it shows an embodiment of a non-transmission-type microscope M, which, in this case, is a SEM (though, in the context of the current invention, it could just as validly be an ion-based microscope, for example). In the Figure, parts which correspond to items in FIG. 1 are indicated using identical reference symbols, and will not be separately discussed here. Additional to FIG. 1 are (inter alia) the following parts:

2a: A vacuum port, which may be opened so as to introduce/remove items (components, specimens) to/from the interior of vacuum chamber 2, or onto which, for example, an ancillary device/module may be mounted. The microscope M may comprise a plurality of such ports 2a, if desired;
 10a, 10b: Schematically depicted lenses/optical elements in illuminator 6;
 12: A voltage source, allowing the specimen holder H, or at least the specimen S, to be biased (floated) to an electrical potential with respect to ground, if desired;
 14: A display, such as a FPD or CRT;
 22a, 22b: A segmented electron detector 22a, comprising a plurality of independent detection segments (e.g. quadrants) disposed about a central aperture 22b (allowing passage of the beam B). Such a detector can, for example, be used to investigate (the angular dependence of) a flux of output (secondary or backscattered) electrons emerging from the specimen S;
 22: An EDS or EDX detector.

Thus the charged particle microscope M as shown in FIG. 2 comprises an optics column O, including a charged particle source 4, a final probe forming lens 6, 10a, 10b and a scanner 8, for focusing a beam B of charged particles emitted from said charged particle source 4 onto a specimen S. The apparatus further comprises a specimen stage A,H positioned downstream of said final probe forming lens 6 and arranged for holding said specimen S. The apparatus furthermore comprises a first detector 22 for detecting emissions of a first type originating from said specimen in response to the incidence of charged particles B emitted from said charged particle source 4. In the embodiment shown, the first detector 22 is said analysis device 22, which—as mentioned before—might be a combined scintillator/photomultiplier or EDS (Energy-Dispersive X-Ray Spectroscopy) module. The apparatus comprises a second detector 22a, 22b for detecting emissions of a second type. Furthermore, the apparatus according to the invention comprises said control device 20 that is connected (by means of lines 20') to said first detector 22 and to said second detector 22a, 22b.

The apparatus shown in FIG. 1 and FIG. 2 may be used in examining a sample with a method according to the invention. In general, embodiments of the method all comprise the general steps of:

Providing a charged particle beam, as well as a sample;
 Scanning said charged particle beam over said sample;
 Detecting, using the first detector, emissions of a first type from the sample in response to the beam scanned over the sample;
 Using spectral information of detected emissions of the first type, assigning a plurality of mutually different phases to said sample;
 Associating, with reference to an HSV color space, a corresponding plurality of different color hues to said plurality of mutually different phases;
 Detecting, using a second detector, emissions of a second type from the sample in response to the beam scanned over the sample; and
 Providing, by a control unit, an image representation of said sample, wherein use is made of emissions of said second type and wherein said image representation contains said associated different color hues for representing said plurality of different phases.

The above method steps will be explained in further detail below.

Figure 3:
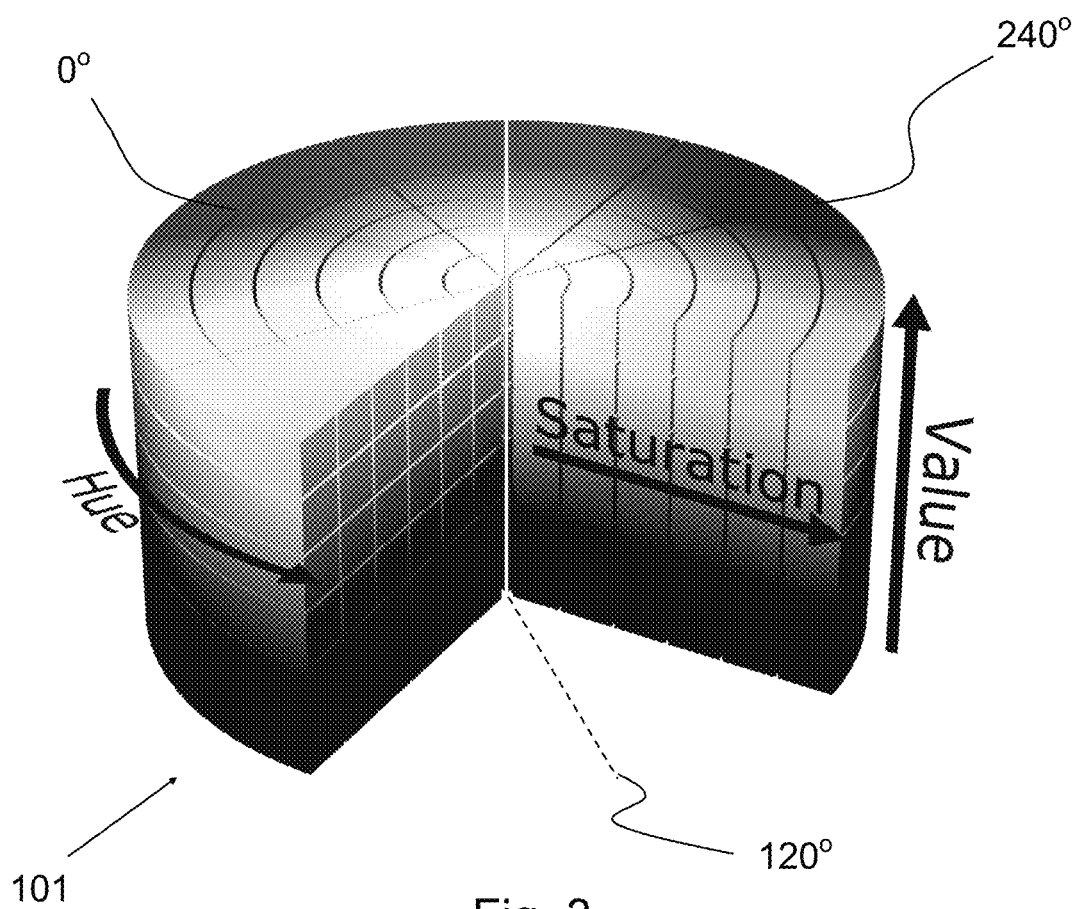
FIG. 3—shows a representation of the HSV color space.

FIG. 3 shows an example of the HSV color space 101 that is used in the method as defined herein. The HSV color space 101 is a color space that uses hue (often referred to as "color", e.g. red, green, blue), saturation (often referred to as the intensity or pureness of the color) and value (often referred to as lightness or darkness of the color) to describe attributes of a specific color. The HSV color space can be represented in a cylindrical geometry as shown in FIG. 3, with hue, its angular dimension, starting at the red primary at 0°, passing through the green primary at 120° and the blue primary at 240°, and then wrapping back to red at 360°. The central vertical axis comprises the neutral, achromatic, or gray colors, ranging from black at value 0 (bottom part in FIG. 3), to white at value 1 (top part of FIG. 3). With increasing radius, i.e. from the center outwards, the saturation of the color increases. Details of the HSV color space are known per se to those skilled in the art of color spaces.

Figure 4:
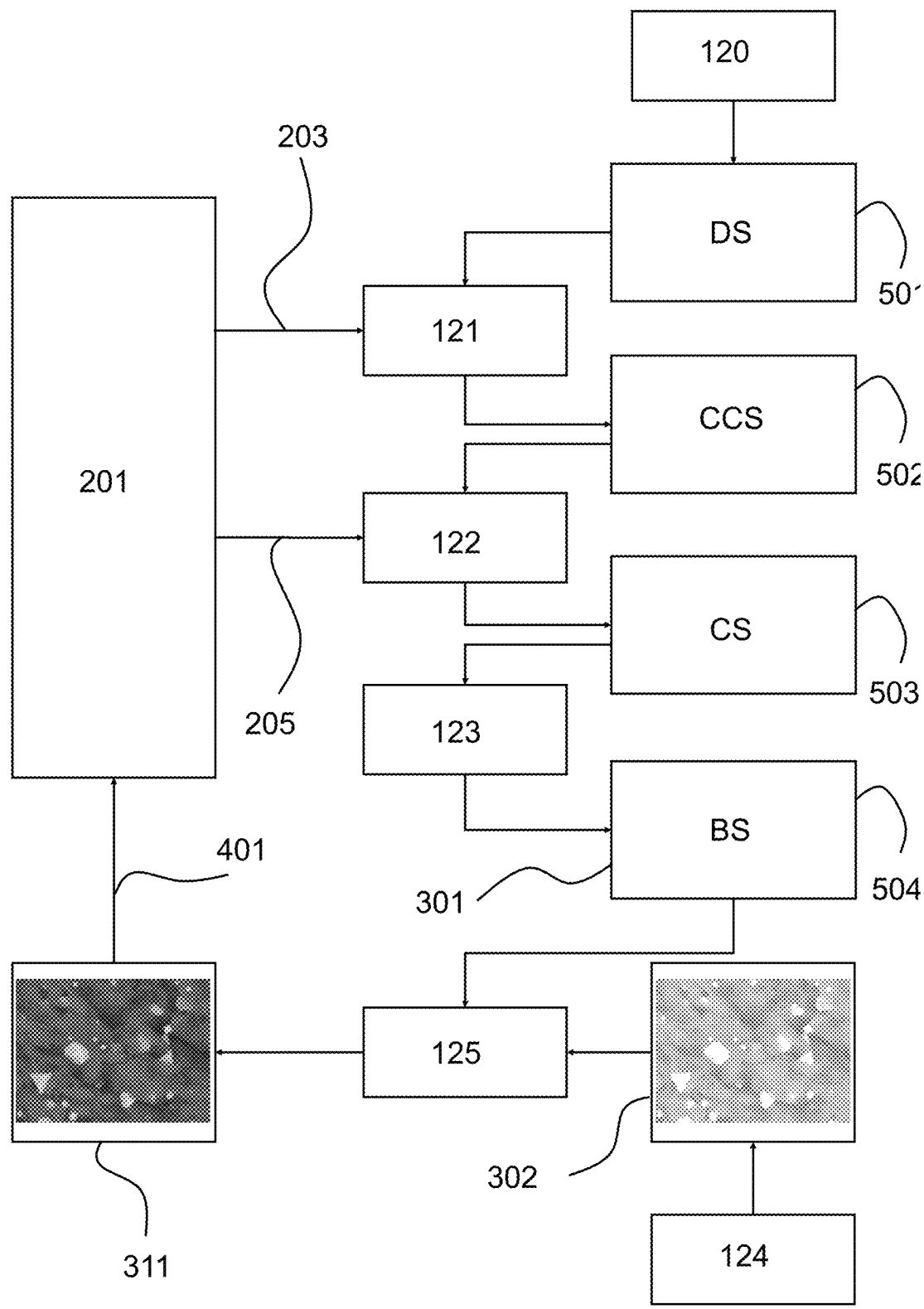
FIG. 4—shows an embodiment of a data stack that may be used in the method as disclosed herein.

FIG. 4 shows an embodiment of the method as disclosed herein, which in general comprises the steps of:

120: Collecting data by scanning a charged particle beam over the sample, and obtaining emissions of a first type using a first detector;

121: Processing said detected emissions of the first type, and in particular using spectral information of detected emissions of the first type for assigning a plurality of mutually different phases to said sample;

122 and 123: Associating, with reference to an HSV color space, a corresponding plurality of different color hues to said plurality of mutually different phases;

124: Detecting, using a second detector, emissions of a second type from the sample in response to the beam scanned over the sample; and 125: Providing, by a control unit, an image representation 311 of said sample, wherein use is made of emissions of said second type 302 and wherein said image representation 311 contains said associated different color hues for representing said plurality of different phases.

In effect, the method uses data collection 120, 124, data analysis 121, color determination 122 and blending 123, and color fusion 125 for providing an image representation 311 of the sample in the HSV color space. The image may be shown to a user 201, and the user may vary several setting 203, 205 to tweak the ultimate result. Shown in FIG. 4 are a plurality of data stacks 501-504 that are used for efficient data storage, and that allow for effective and rapid data processing of acquired data, such that substantially real-time analysis is possible.

FIG. 4 will now be discussed in more detail. In multimodal color electron microscopy, the central idea is to encode multimodal information about the sample by means of color 301 superimposed on the conventional grayscale electron image 302. The method according to this embodiment comprises the steps of data collection 120; 124, spectral processing 121, coloring 122, blending 123 and fusion 125 which enables the efficient creation of a colored image 311 from a stream of raw input data 120; 124, such as X-ray photon detection events in EDS (energy dispersive spectroscopy).

In particular, the following are exemplary steps of the method according to this embodiment, which might be executed sequentially or in parallel, and synchronously or asynchronously.

Figure 5:
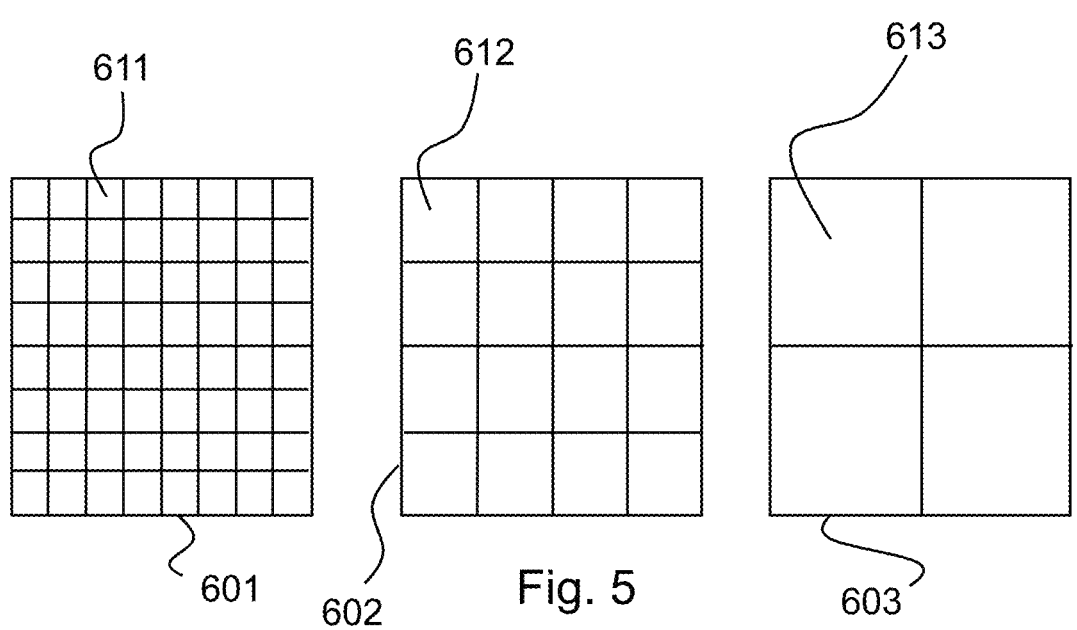
FIG. 5—shows an embodiment of the method as disclosed herein.

In the data collection 120; 124 step, a data structure 501 called a "data cube" or a "data stack" DS is created and maintained. The main task of the data stack DS is to keep the raw input data 120 in a preferably hierarchical organization, thereby enabling efficient computational processing. Such a hierarchical data cube may consist of several data layers 601-603 (see FIG. 5), wherein each layer consists 601-603 of sub-areas 611-613 called superpixels. Each data layer corresponds to the same area of the sample. In the right hand drawing of FIG. 5, the area of superpixels 613 are relatively large, and in the left hand drawing of FIG. 5, the area of superpixels 611 are relatively small. For relatively sparse spectral data, a large superpixel 613 can be associated with the data entry, and when granularity increases it is possible to fill the smaller pixels 611 with the accompanying data. This way, superpixels can be connected and combined across the layers 601-603. In some embodiments, the superpixels may be determined based on the second type of emission detected by the second detector For purposes of the embodiment as shown in FIG. 4, each superpixel contains a set of collected spectral data, either in a raw format (e.g. a list of EDS events) or in a more efficient and compact data structure (compact format, e.g. an energy histogram). To optimize the performance and the memory requirements of the data processing, these representations may be alternated (i.e. alternating between raw format and compact format).

In the second step 121, the raw data collected in the datacube 501 is processed and analysed. The data cube 501 can be augmented, but in the embodiment shown a new data cube 502 is created and updated. In this embodiment, the new data cube 502 contains the same superpixel structure per layer, and is called chemical composition stack CCS. In the CCS a superpixel contains the analytical results corresponding to the collected raw data DS, obtained by using a spectrum processing library (e.g. chemical quantification). In addition, the data analysis result may be augmented with a data quality metric (also called a "confidence metric") that expresses the certainty of the result. Global predictors may be used based on spectral clustering and other data processing algorithms which might improve the analytical results dramatically.

In a third step 122, the analysed data 502 is used as an input to a color determination algorithm. The data quality metric may be used in this color determination algorithm. The result is a color stack CS, which in this case is a new data cube 503. Alternatively, an augmented data cube may be used. In the color stack CS, a pixel (or superpixel) has an associated color, and in particular an associated hue, to represent a phase.

In a fourth step 123, the hierarchical color structure (color stack CS) must be blended into a flat color map that can be subsequently used for fusion. The flat color map may be two-dimensional. Colors from multiple layers 601-603 are combined, to produce a colored data stack 504 consisting of a single layer (the blended stack BS). This blending may be done based on (a) the expression of the confidence metric as described above, and/or (b) the expression of the confidence about the superpixel shape (e.g. larger superpixels have a high chance of missing out finer regions). In an embodiment, step (a) may be expressed by primarily altering the color, in particular its transparency, saturation, hue or other characteristics, and step (b) may be expressed by primarily applying a blur-like operator to the projection of the superpixel shape. Preferred embodiments for (b) involve a simple kernel-based blur and an anisotropic diffusion operator.

The data quality metric described above can be used in the flattening of the color stack CS. This improves the speed and quality of the final result.

The pixels that are used can be regular (square) pixels, SLIC (Simple Linear Iterative Clustering) pixels, such as SLIC0 pixels. Graph algorithms can be used for pixel merging that proceed from the finest layers 601 towards the coarsest layers 603 and maintain some properties of the pixels 611-613 that are desirable for good visual appearance. Parallelization may be used (for the purposes of speeding up the analysis) in these algorithms, in other cases the focus may be brought towards the quality of the image itself.

In a fifth step 125, In the last step, the flat color map (blended stack BS) is fused with a grayscale image obtained in data acquisition step 124. A 2D or a 3D geometrical transformation might be applied to the color map to enable a multimodal, multi-viewpoint registration of the map and the image. The fusion is proposed by using operations preferably in the HSV color domain, although other domains such as RGB and/or RGBA are conceivable as well. The result is a colored image 311, which can be shown 401 to the user 201.

The user 201 may determine several settings 203 relating to the spectrum processing 121, for example. The user 201 may determine several settings 205 with respect to a color scheme that can be used in the step of coloring 122. Additional settings and control for the user 201 are conceivable as well.

Further, the step of blending 123 is relatively specific in case the multi-layer data stacks 501-503 are used. It is conceivable that the step of blending 123 can be omitted in case a different data structure DS is used. On the other hand, the use of such a data structure DS allows for effective and efficient data processing, and hence allows for substantially real-time provision of colored images.

The method is described above with respect to one or more embodiments. The desired protection is determined by the appended claims.

The invention claimed is:

1. A method of examining a sample using a charged particle microscope, comprising the steps of:
   Providing a charged particle beam, as well as a sample;
   Scanning the charged particle beam over the sample;
   Detecting, using a first detector, emissions of a first type from the sample in response to the beam scanned over the sample;
   Storing the detected emissions of the first type in a spectral data stack including a plurality of data stack layers, wherein at least one of the plurality of data stack layers comprises a plurality of pixels, wherein each pixel is associated with a part of the sample;
   Using spectral information of detected emissions of the first type, assigning a plurality of mutually different phases to the sample;
   Associating, with reference to an HSV color space, a corresponding plurality of different color hues to the plurality of mutually different phases;
   Detecting, using a second detector, emissions of a second type from the sample in response to the beam scanned over the sample; and
   Providing, by a control unit, an image representation of the sample, wherein use is made of emissions of the second type and wherein the image representation contains the associated different color hues for representing the plurality of different phases.

2. The method according to claim 1, wherein storing the detected emissions of the first type in the spectral data stack includes storing the detected emissions of the first type in a first data stack layer of the plurality of data stack layers.

3. The method according to claim 1, wherein scanning the charged particle beam over the sample includes scanning the charged particle beam over a plurality of analysis points of the sample, and each pixel in a first data stack layer of the plurality of data stack layers associates to one of the plurality of analysis points.

4. The method according to claim 1, wherein each pixel is associated with a part of the sample includes storing combined detected emissions of the first type from the part of the sample in the associated pixel.

5. The method according to claim 1, wherein the number of pixels is different for each data stack layer.

6. The method according to claim 5, wherein the number of pixels in each data stack layer decreases with the increased data stack layers.

7. The method according to claim 1, further comprising storing the plurality of mutually different phases in a chemical composition data stack, wherein the number of layers and pixels in the spectral data stack and the chemical composition stack is identical.

8. The method according to claim 1, further comprising storing the plurality of different color hues in a color data stack, wherein the number of layers and pixels in the spectral data stack and the color data stack is identical.

9. The method according to claim 8, further comprising flattening the color data stack into a blended stack of a single layer by combining multiple layers of the color data stack, and using the blended stack in providing the image representation.

10. A charged particle microscope for examining a sample, comprising:
    an optics column, including a charged particle source, a final probe forming lens and a scanner, for focusing a beam of charged particles emitted from the charged particle source onto the sample;
    a specimen stage positioned downstream of the final probe forming lens and arranged for holding the sample;
    a first detector for detecting emissions of a first type originating from the sample in response to the incidence of charged particles emitted from the charged particle source;
    a second detector for detecting emissions of a second type originating from the sample in response to the incidence of charged particles emitted from the charged particle source; and
    a control unit and a processing device connected to the first detector and the second detector, the control unit is configured to:
    Scan the charged particle beam over the sample;
    Detect emissions of the first type from the sample in response to the beam scanned over the sample;
    Store the detected emissions of the first type in a spectral data stack including a plurality of data stack layers, each data stack layer includes a different number of pixels, each pixel associated with a part of the sample;
    Assign a plurality of mutually different phases to the sample based on spectral information of detected emissions of the first type;
    Associate, with reference to an HSV color space, a corresponding plurality of different color hues to the plurality of mutually different phases;
    Detect emissions of the second type from the sample in response to the beam scanned over the sample; and
    Provide an image representation of the sample, wherein use is made of emissions of the second type and wherein the image representation contains the associated different color hues for representing the plurality of different phases.

11. The charged particle microscope according to claim 10, wherein the control unit is further configured to store the plurality of mutually different phases in a chemical composition data stack, and store the plurality of different color hues in a color data stack, wherein the chemical composition data stack and the color data stack have the same structure as the spectral data stack.

12. The charged particle microscope according to claim 11, wherein the control unit is further configured to generate a two dimensional blended stack of a single layer by combining multiple layers of the color data stack, and provide the image presentation includes combine the blended stack with the emissions of the second type.

13. The charged particle microscope according to claim 10, wherein the first detector comprises an EDS detector.

14. The charged particle microscope according to claim 10, wherein the second detector comprises an electron detector.

* * * * *